(12) United States Patent
Cheng et al.

(10) Patent No.: US 11,342,284 B2
(45) Date of Patent: May 24, 2022

(54) SEMICONDUCTOR CHIP

(71) Applicant: Au Optronics Corporation, Hsinchu (TW)

(72) Inventors: Hsiang-Chi Cheng, Hsinchu (TW); Shyh-Bin Kuo, Hsinchu (TW); Chung-Hung Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/017,682

(22) Filed: Sep. 11, 2020

(65) Prior Publication Data

US 2021/0134738 A1   May 6, 2021

Related U.S. Application Data

(60) Provisional application No. 62/930,794, filed on Nov. 5, 2019.

(30) Foreign Application Priority Data

May 19, 2020   (TW) ................................. 109116545

(51) Int. Cl.
  *H01L 23/50*   (2006.01)
  *H01L 23/00*   (2006.01)
  *H01L 25/07*   (2006.01)

(52) U.S. Cl.
  CPC ............ *H01L 23/562* (2013.01); *H01L 23/50* (2013.01); *H01L 25/072* (2013.01)

(58) Field of Classification Search
  CPC ............. H01L 23/564; H01L 21/31133; H01L 21/31144; H01L 23/293; H01L 23/3157; H01L 23/367; H01L 23/3735; H01L 23/562; H01L 24/32; H01L 29/45; H01L 2224/32225; H01L 2924/07025; H01L 2924/10253; H01L 2924/10272; H01L 2924/13091; H01L 2924/15787; H01L 2924/3512; H01L 29/7827; H01L 29/1608; H01L 2224/48247; H01L 2224/73265; H02P 27/08
  See application file for complete search history.

(56) References Cited

U.S. PATENT DOCUMENTS

2014/0117899 A1* 5/2014 Tasaka .................. H02M 7/003
                                                 318/400.21

FOREIGN PATENT DOCUMENTS

CN       208955837       6/2019
CN       110602874       12/2019

* cited by examiner

*Primary Examiner* — Elias Ullah
(74) *Attorney, Agent, or Firm* — JCIPRNET

(57) ABSTRACT

A chip is provided. The chip is provided with a circuit block. The circuit block includes a first transistor and a second transistor. The first transistor is divided into a plurality of first sub-transistors connected in parallel. The second transistor is divided into a plurality of second sub-transistors connected in parallel. The first sub-transistors and the second sub-transistors are disposed in a first row and a second row of the circuit block in a staggered manner. The first transistors disposed in the first row and the second row respectively receive a first input signal through different signal lines. The second transistors disposed in the first row and the second row respectively receive a second input signal through different signal lines.

18 Claims, 7 Drawing Sheets

SEMICONDUCTOR CHIP

CROSS-REFERENCE TO RELATED APPLICATION

This application claims the priority benefits of U.S. provisional application Ser. No. 62/930,794, filed on Nov. 5, 2019, and Taiwan application serial no. 109116545, filed on May 19, 2020. The entirety of each of the above-mentioned patent applications is hereby incorporated by reference herein and made a part of this specification.

BACKGROUND OF THE INVENTION

1. Field of the Invention

The invention relates to a chip, and in particular, to a semiconductor chip.

2. Description of Related Art

In a current electronic device, when a chip in the electronic device is cracked, the cracking often affects a signal or voltage transmission in the chip, thereby causing a circuit block in the chip to be completely disabled.

SUMMARY OF THE INVENTION

The invention provides a chip, which may effectively prevent a circuit block from being completely disabled due to cracking.

The chip of the invention includes a circuit block. The circuit block includes a first transistor and a second transistor. The first transistor is divided into a plurality of first sub-transistors connected in parallel. The second transistor is divided into a plurality of second sub-transistors connected in parallel. The first sub-transistors and the second sub-transistors are disposed in a first row and a second row of the circuit block in a staggered manner. The first transistors disposed in the first row and the second row respectively receive a first input signal through different signal lines. The second transistors disposed in the first row and the second row respectively receive a second input signal through different signal lines.

The chip of the invention includes a circuit block, a power trace, and a power supply circuit. The power trace is divided into a first power trace and a second power trace connected in series. The power trace is coupled to the circuit block. The power supply circuit is divided into a first power supply circuit and a second power supply circuit. The power supply circuit is coupled to the power trace. The power supply circuit provides a first voltage to the circuit block through the power trace. Two ends of the first power trace are respectively coupled to the first power supply circuit and the second power supply circuit. Two ends of the second power trace are respectively coupled to the first power supply circuit and the second power supply circuit.

Based on the above, the first transistor and the second transistor are disposed in the first row and the second row of the circuit block in a staggered manner, and receive the input signal through different signal lines, so that when a crack occurs on the chip, complete disability of the circuit block may be effectively avoided.

DESCRIPTION OF THE EMBODIMENTS

Figure 1A:
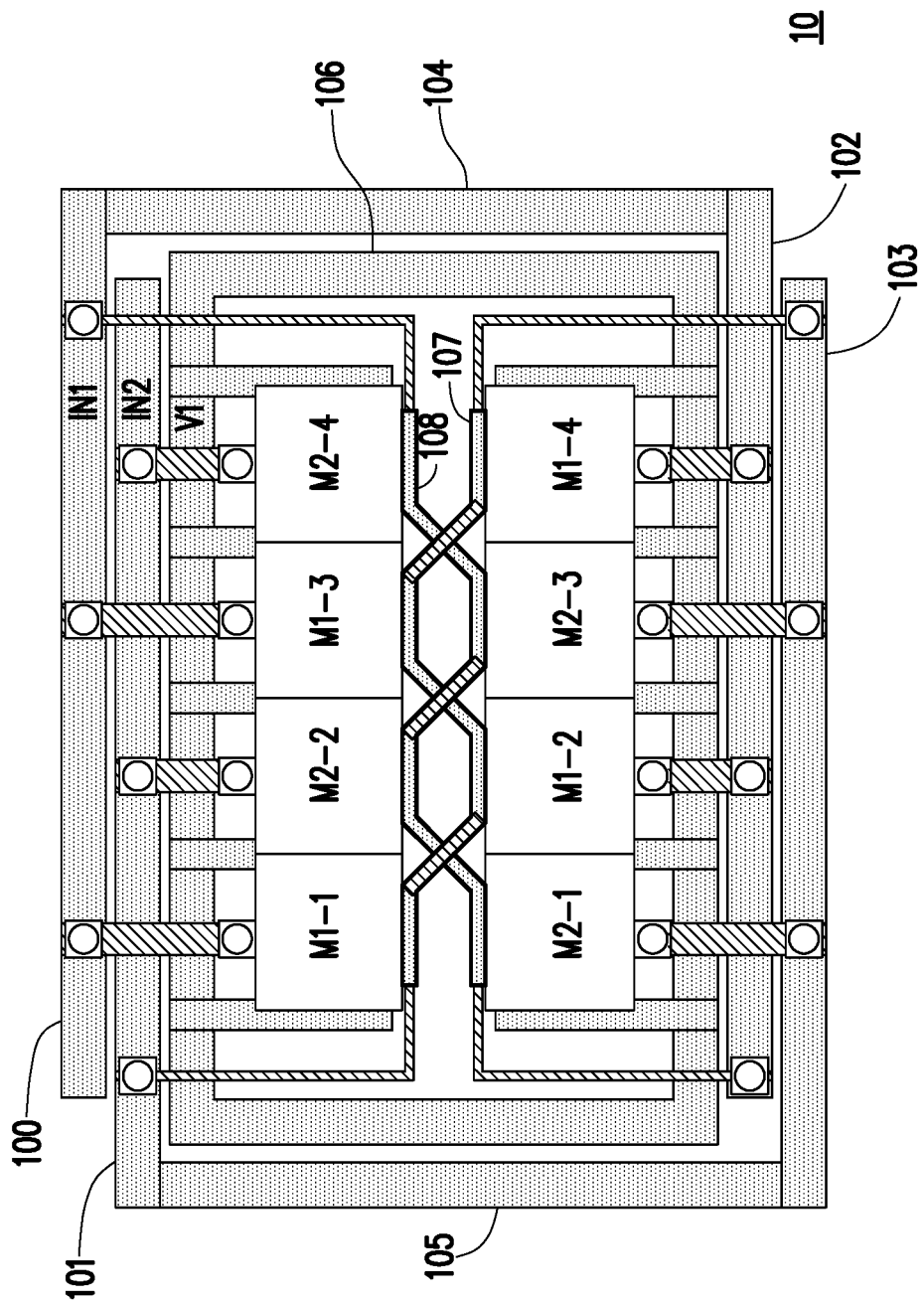
FIG. 1A is a schematic diagram of a circuit block according to an embodiment of the invention.

FIG. 1A is a schematic diagram of a circuit block 10 according to an embodiment of the invention. The circuit block 10 has transistors M1, M2, and signal lines 100-106. Briefly, the transistors M1 and M2 are respectively disposed in a first row and a second row of the circuit block 10. The transistors M1 and M2 disposed in the first row may obtain an input signal and a first voltage through signal lines 100, 101, and 106. The transistors M1 and M2 disposed in the second row may obtain an input signal and a first voltage through signal lines 102, 103, and 106. In other words, the transistors M1 and M2 in the circuit block 10 are disposed in the first row and the second row to respectively obtain the input signal and the first voltage through different signal lines. As a result, the circuit block 10 may effectively avoid overall disability or abnormality of the transistors M1 and M2 when the signal lines 101-106 are cracked.

First, it should be noted that, signal lines drawn by shading shown in FIG. 1A and the signal lines 100-106 are disposed at different layers or different heights, and the signal lines and the transistors M1 and M2 disposed at different layers or different heights may be connected through vias. Therefore, during connection through the signal lines drawn by shading, the transistors M1 and M2 may be connected across the signal lines 100-106 to receive appropriate signals, which shall belong to a common knowledge in the art.

In detail, the transistor M1 has sub-transistors M1-1 to M1-4, and the sub-transistors M1-1 to M1-4 are connected to each other in parallel, so that the sub-transistors M1-1 to M1-4 may be equivalent to a single transistor M1 for operation. Similarly, the sub-transistors M2-1 to M2-4 are connected to each other in parallel, and may be equivalent to a single transistor M2 for operation. For example, the transistors M1 and M2 may be N type metal-oxide-semiconductor field-effect transistors (NMOSFET), a P-type metal-oxide-semiconductor field-effect transistors (PMOSFET), or other suitable transistors.

The sub-transistors M1-1 to M1-4 and M2-1 to M2-4 may have substantially the same length and width. The sub-transistors M1-1 to M1-4 are sequentially disposed in a first column of a first row, a second column of a second row, a third column of the first row, and a fourth column of the second row. The sub-transistors M2-1 to M2-4 are sequentially disposed in a first column of the second row, a second column of the first row, a third column of the second row, and a fourth column of the first row. Therefore, in each row and each column of the circuit block 10, the sub-transistors M1-1 to M1-4 of the transistor M1 and the sub-transistors M2-1 to M2-4 of the transistor M2 are all disposed in a staggered manner. The sub-transistors M1-1 to M1-4 of the transistor M1 and the sub-transistors M2-1 to M2-4 of the transistor M2 are disposed in the first row and the second row in a checkerboard pattern and in a staggered manner.

The signal lines 100 and 101 are disposed on an upper side of the circuit block 10, and the signal lines 102 and 103 are disposed on a lower side of the circuit block. The signal lines 100 and 101 are adjacent to a first row of the circuit block 10, and the signal lines 100 and 101 are away from a second row of the circuit block 10. The signal lines 102 and 103 are adjacent to the second row of the circuit block 10, and the signal lines 102 and 103 are away from the first row of the circuit block 10. The signal lines 100 and 101 may be respectively used to provide input signals IN1 and IN2 for the sub-transistors in the first row. The signal lines 102 and 103 may be respectively used to provide input signals IN1 and IN2 for the sub-transistors in the second row.

The signal line 104 is disposed on a right side of the circuit block 10, and two ends of the signal line 104 are respectively coupled to the signal lines 100 and 102. The signal line 105 is disposed on a left side of the circuit block 10, and two ends of the signal line 105 are respectively coupled to the signal lines 101 and 103. In other words, the signal lines 104 and 105 are respectively disposed on the two sides of the circuit block 10. The signal lines 100, 102, and 104 may jointly form a U-shaped structure surrounding the transistors M1 and M2. The signal lines 101, 103, and 105 may jointly form another U-shaped structure surrounding M1 and M2. Openings of the two U-shaped structures are disposed opposite to each other.

The signal line 106 completely surrounds the transistors M1 and M2. The signal line 106 is located on an upper side of the circuit block 10 and may be disposed between the signal lines 100 and 101 and the first row of the circuit block 10. The signal line 106 is located on a lower side of the circuit block 10 and may be disposed between the signal lines 103 and 104 and the second row of the circuit block 10. The signal line 106 is located on the right side of the circuit block 10 and may be disposed between the signal line 105 and a fourth column of the circuit block 10. The signal line 106 is located on the left side of the circuit block 10 and may be disposed between the signal line 105 and a first column of the circuit block 10.

The signal lines 100, 102, 104 may provide the input signal IN1 for the transistors M1, M2, the signal lines 101, 103, 105 may provide the input signal IN2 for the transistors M1, M2, and the signal line 106 may provide a first voltage V1 for the transistors M1, M2.

In the present embodiment, a first terminal of the transistor M1 receives the input signal IN1, a second terminal of the transistor M1 receives the first voltage V1, and a third terminal of the transistor M1 receives the input signal IN2. In order to achieve the foregoing coupling relationship, first terminals of the sub-transistors M1-1, M1-3 of the transistor M1 in the first row are coupled to the signal line 100, and second terminals of the sub-transistors M1-1, M1-3 are coupled to the signal line 106. First terminals of the sub-transistors M1-2, M1-4 of the transistor M1 in the second row are coupled to the signal line 102, and second terminals of the sub-transistors M1-2, M1-4 are coupled to the signal line 106. All the sub-transistors M1-1 to M1-4 of the transistor M1 couple the third terminals of each of the sub-transistors M1-1 to M1-4 to each other through the signal line 107 and receive the input signal IN2, where the signal line 107 is disposed between the first row and the second row of the circuit block 10. The signal line 107 is disposed diagonally and alternately, and is further connected to the third terminals of the sub-transistors M1-1 to M1-4 disposed alternately in the first row and the second row.

Similarly, a first terminal of the transistor M2 receives the input signal IN2, a second terminal of the transistor M2 receives the first voltage V1, and a third terminal of the transistor M1 receives the input signal IN1. In order to achieve the foregoing coupling relationship, first terminals of the sub-transistors M2-2, M2-4 of the transistor M2 in the first row are coupled to the signal line 101, and second terminals of the sub-transistors M2-2, M2-4 are coupled to the signal line 101. First terminals of the sub-transistors M2-1, M2-3 of the transistor M2 in the second row are coupled to the signal line 102, and second terminals of the sub-transistors M2-1, M2-3 are coupled to the signal line 106. All the sub-transistors M2-1 to M2-4 of the transistor M1 couple the third terminals of each of the sub-transistors M2-1 to M2-4 to each other through the signal line 108 and receive the input signal IN1, where the signal line 108 is disposed between the first row and the second row of the circuit block 10. The signal line 108 is disposed diagonally and alternately, and is further connected to the third terminals of the sub-transistors M2-1 to M2-4 disposed alternately in the first row and the second row.

Therefore, the sub-transistors M1-1 to M1-4 of the transistor M1 in the circuit block 10 and the sub-transistors M2-1 to M2-4 of M2 are all disposed alternately in each column and each row of the circuit block 10. The transistors M1-1, M2-1, M1-3, M2-4 disposed in the first row may receive the input signals IN1, IN2 and the first voltage V1 through the signal lines 100, 101, 106, and the transistors M2-1, M1-1, M2-3, M1-4 disposed in the second row may receive the input signals IN1, IN2 and the first voltage V1 through the signal lines 102, 103, and 106. Therefore, the circuit block 10 may effectively prevent the transistor M1 or the transistor M2 from being completely disabled when a crack occurs on any of the signal lines 100 to 103.

Furthermore, by disposing the sub-transistors M1-1 to M1-4 and M2-1 to M2-4 alternately in the first row and the second row of the circuit block 10, a gradient difference of process imperfections may also be evenly distributed to the transistors M1 and M2. In other words, the transistors M1 and M2 are disposed alternately in each column and each row, which may effectively reduce the influence of process imperfections on the transistors M1 and M2. When the transistors M1 and M2 have a differential circuit structure, a better matching effect may be achieved through the design of the circuit block 10.

Figure 1B:
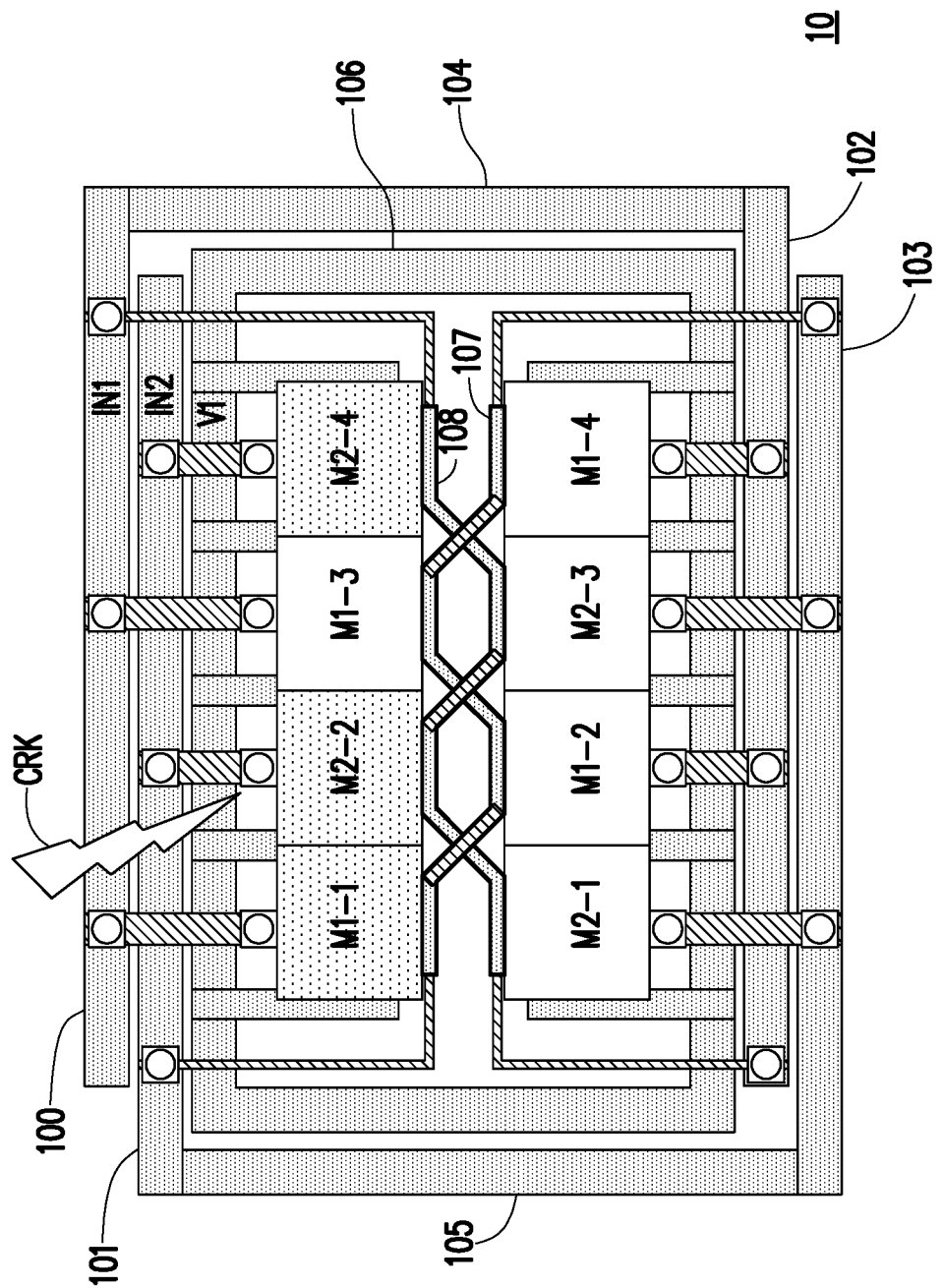
FIG. 1B is a schematic diagram of a circuit block on which a crack occurs according to an embodiment of the invention.

FIG. 1B is a schematic diagram of a circuit block 10 on which a crack occurs according to an embodiment of the invention. In the present embodiment, the circuit block 10 may be disposed on a flexible substrate. Due to the bendability of the flexible substrate, a crack CRK is more likely to occur in the circuit block 10 on the flexible substrate. In detail, the crack CRK occurs on the signal lines 100, 101, 106 of the circuit block 10, that is, the crack CRK occurs on the upper side of the circuit block 10. Therefore, the first terminals of the sub-transistor M1-1 cannot receive the input signal IN1, and the first terminals of the sub-transistor M2-2 and M2-4 cannot receive the input signal IN2. In other words, when the crack CRK occurs, the sub-transistors M1-1, M2-2, and M2-4 in the first row are incapable of operating normally.

However, the first terminal of the transistor M1-3 in the first row may receive the input signal IN1 through the signal line 100, and the second terminal of the transistor M1-3 may receive the first voltage V1 through the ring-shaped signal line 106. In addition, the sub-transistors M2-1, M1-2, M2-3, M1-4 in the second row may respectively receive input signals IN1, IN2 from the signal lines 102, 103. In addition, the third terminal of the sub-transistors M1-1 to M1-4 may receive the input signal IN2 through the signal line 107, and the third terminal of the sub-transistors M2-1 to M2-4 may receive the input signal IN1 through the signal line 108. Therefore, the transistor M1-3 in the first row and the sub-transistors M2-1, M1-2, M2-3, and M1-4 in the second row are capable of operating normally.

Briefly, the circuit block 10 is alternately disposed in the first row and the second row through the sub-transistors M1-1 to M1-4 and M2-1 to M2-4. In addition, the circuit block 10 further provides the input signal IN1 on two sides of the circuit block 10 through the signal lines 100 and 102, and provides the input signal IN2 on two sides of the circuit block 10 through the signal lines 101 and 103. In this way, when a crack CRK occurs on the circuit block 10, complete disability of one of the transistors M1 or M2 as a result of the crack CRK occurring on the only signal line connected to the transistor M1 or M2 may be effectively avoided. In other words, when the crack CRK occurs in the circuit block 10, the transistors M1 and M2 may still receive the input signals IN1, IN2 and the first voltage V1 to operate without causing complete disability of the circuit block 10.

In another embodiment, those skilled in the art may certainly change the circuit block 10 according to different design requirements. For example, the transistors M1 and M2 of the circuit block 10 may be divided into more than four sub-transistors. In other words, the number of columns of the circuit block 10 may be increased or decreased, as long as the circuit block 10 has at least two columns. For example, the signal lines 100, 102, 104 of the circuit block 10 may be not necessarily a U-shaped structure. In other words, the signal lines 100, 102, and 104 are also replaced by a signal line structure that completely or partially surrounds the transistors M1 and M2, as long as the circuit block 10 is capable of receiving the input signal IN1 at both the upper side and the lower side. The same modification is also applicable to the signal lines 101, 103, 105, and the signal lines 101, 103, 105 may be replaced by the signal lines that completely surround the transistors M1, M2. In this way, the input signals IN1 and IN2 are provided through the signal lines completely surrounding the transistors, and the circuit block 10 may completely avoid failure of any of the sub-transistors M1-1 to M1-4, M2-1 to M2-4 due to cracks.

Figure 2:
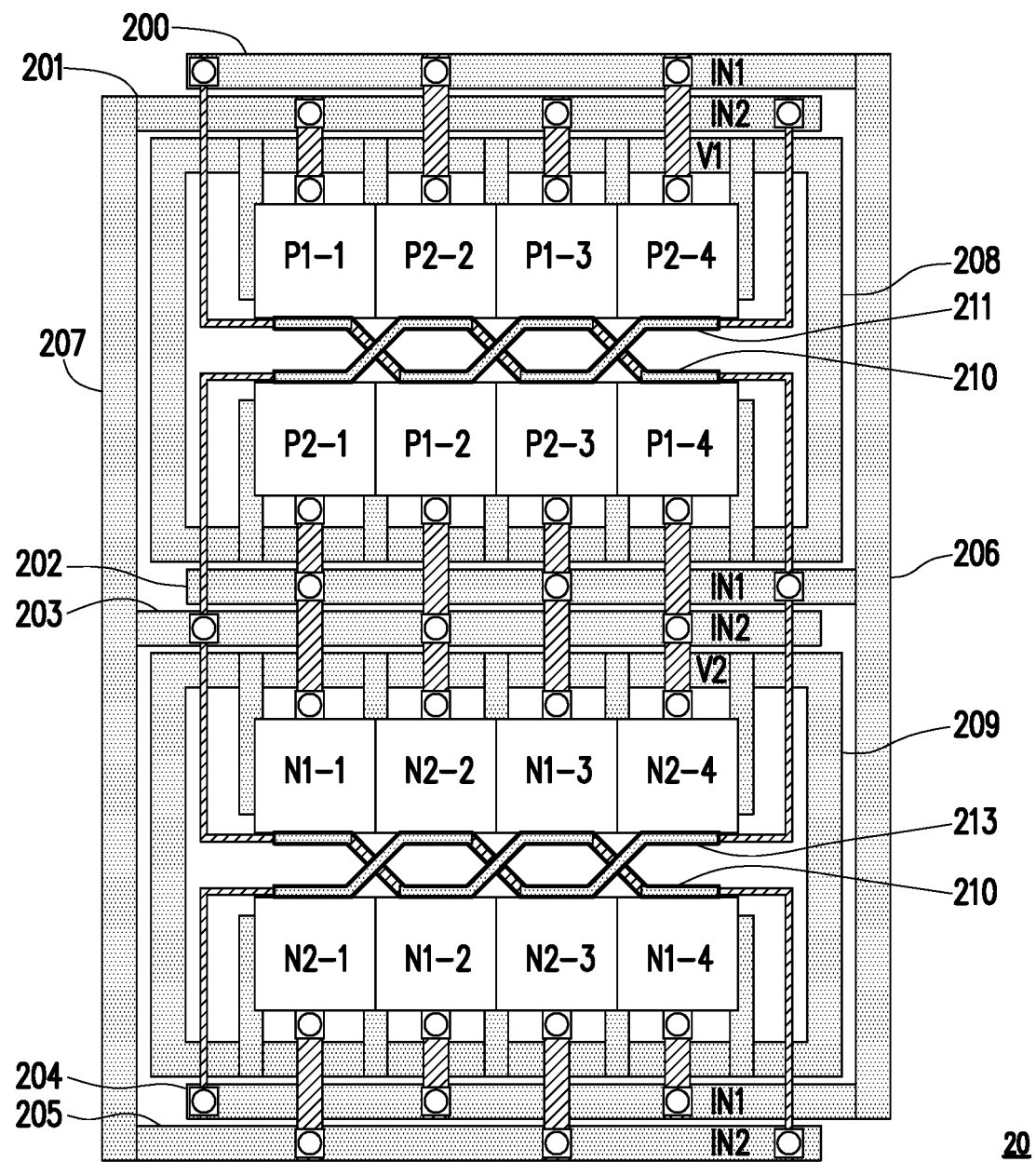
FIG. 2 is a schematic diagram of a circuit block according to an embodiment of the invention.

FIG. 2 is a schematic diagram of a circuit block 20 according to an embodiment of the invention. The circuit block 20 has transistors P1, P2, N1, and N2. In the present embodiment, the transistors P1 and P2 may be P-type metal-oxide-semiconductor field-effect transistors, and the transistors N1 and N2 may be N-type metal-oxide-semiconductor field-effect transistors. The transistor P1 has sub-transistors P1-1 to P1-4, and the transistor P2 has sub-transistors P2-1 to P2-4. The transistor N1 has sub-transistors N1-1 to N1-4, and the transistor N2 has sub-transistors N2-1 to N2-4.

The sub-transistors P1-1 to P1-4 and P2-1 to P2-4 may have substantially the same length and width, and the sub-transistors N1-1 to N1-4 and N2-1 to N2-4 may have substantially the same length and width. The sub-transistors P1-1 to P1-4 are sequentially disposed in a first column of a first row, a second column of a second row, a third column of the first row, and a fourth column of the second row. The sub-transistors P2-1 to P2-4 are sequentially disposed in a first column of the second row, a second column of the first row, a third column of the second row, and a fourth column of the first row. Therefore, in each row and each column of the circuit block 10, the sub-transistors P1-1 to P1-4 of the transistor P1 and the sub-transistors P2-1 to P2-4 of the transistor P2 are all disposed in a staggered manner. The sub-transistors P1-1 to P1-4 of the transistor P1 and the sub-transistors P2-1 to P2-4 of the transistor P2 are disposed in the first row and the second row alternately in a checkerboard pattern.

The sub-transistors N1-1 to N1-4 are sequentially disposed in a first column of a third row, a second column of a fourth row, a third column of the third row, and a fourth column of a fourth row. The sub-transistors N2-1 to N2-4 are sequentially disposed in a first column of the fourth row, a second column of the third row, a third column of the fourth row, and a fourth column of the third row. Therefore, in each row and each column of the circuit block 10, the sub-transistors N1-1 to N1-4 of the transistor N1 and the sub-transistors N2-1 to N2-4 of the transistor N2 are all disposed in a staggered manner. The sub-transistors N1-1 to N1-4 of the transistor N1 and the sub-transistors N2-1 to N2-4 of the transistor N2 are disposed in the third row and the fourth row alternately in a checkerboard pattern.

A signal line 200 is disposed on an upper side of the circuit block 20, a signal line 202 is disposed between the second row and the third row of the circuit block 20, and a signal line 204 is disposed on a lower side of the circuit block 20. A signal line 201 is disposed on an upper side of the circuit block 20, a signal line 203 is disposed between the second row and the third row of the circuit block 20, and a signal line 205 is disposed on a lower side of the circuit block 20. A signal line 206 is connected to the signal lines 200, 202, and 204, and a signal line 207 is connected to the signal lines 201, 203, and 205. A signal line 208 completely surrounds the transistors P1 and P2, and a signal line 209 completely surrounds the transistors N1 and N2. The signal lines 200, 202, and 204 may be used to provide an input signal IN1, the signal lines 201, 203, and 205 may be used to provide an input signal IN2, the signal line 208 may be used to provide a first voltage V1, and the signal line 209 may be used to provide the first voltage V1.

In addition, the signal line 210 is disposed between the first row and the second row of the circuit block 20, and the signal line 210 is disposed diagonally and alternately and is further connected to third terminals of the sub-transistors P1-1 to P1-4 disposed alternately in the first row and the second row. Similarly, the signal line 211 is disposed between the first row and the second row of the circuit block 20 to be connected to the third terminals of the sub-transistors P2-1 to P2-4. The signal line 212 is disposed between the third row and the fourth row of the circuit block 20 to be connected to the third terminals of the sub-transistors N1-1 to N1-4. The signal line 213 is disposed between the third row and the fourth row of the circuit block 20 to be connected to the third terminals of the sub-transistors N2-1 to N2-4.

Therefore, the sub-transistors P1-1, P2-2, P1-3, and P2-4 in the first row of the circuit block 20 may obtain the input signals IN1, IN2 and the first voltage V1 through the signal lines 200, 201, and 208. The sub-transistors P2-1, P1-2, P2-3, and P1-4 in the second row of the circuit block 20 may obtain the input signals IN1, IN2 and the first voltage V1 through the signal lines 202, 203, and 208. The sub-transistors N1-1, N2-2, N1-3, and N2-4 in the third row of the circuit block 20 may obtain the input signals IN1, IN2 and a second voltage V2 through the signal lines 202, 203, and 209. The sub-transistors N2-1, N1-2, N2-3, and N1-4 in the fourth row of the circuit block 20 may obtain the input signals IN1, IN2 and the second voltage V2 through the signal lines 204, 205, and 209.

In this way, when the crack CRK occurs in the circuit block 20, the transistors P1, P2, N1, and N2 may still receive the input signals IN1, IN2, the first voltage V1, and the second voltage V2 to operate without causing complete disability of the circuit block 20.

Figure 3A:
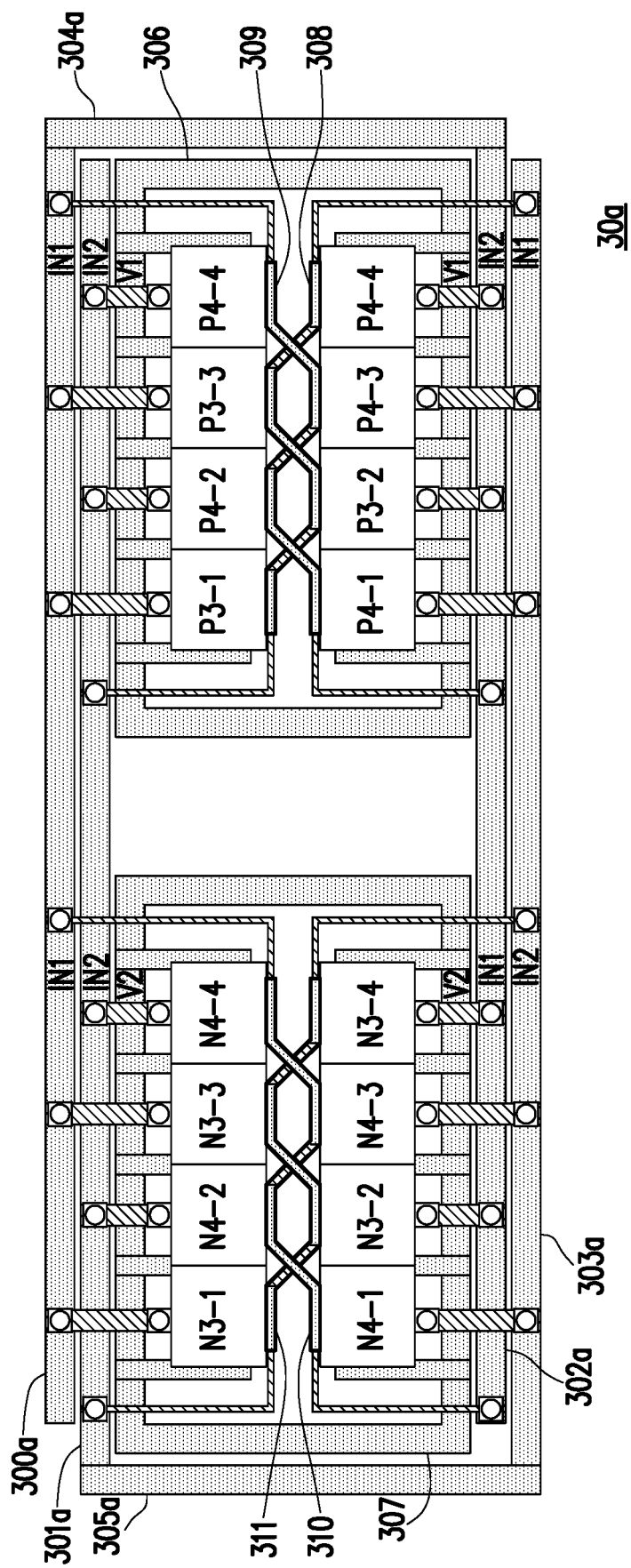
FIG. 3A is a schematic diagram of a circuit block according to an embodiment of the invention.

FIG. 3A is a schematic diagram of a circuit block 30a according to an embodiment of the invention. The circuit block 30a has transistors N3, N4, P3, and P4. The transistors P3 and P4 may be P-type metal-oxide-semiconductor field-effect transistors, and the transistors N3 and N4 may be N-type metal-oxide-semiconductor field-effect transistors. The transistor P3 has sub-transistors P3-1 to P3-4, and the transistor P4 has sub-transistors P4-1 to P4-4. The transistor N3 has sub-transistors N3-1 to N3-4, and the transistor N4 has sub-transistors N4-1 to N4-4.

The sub-transistors P3-1 to P3-4 and P4-1 to P4-4 may have substantially the same length and width, and the sub-transistors N3-1 to N3-4 and N4-1 to N4-4 may have substantially the same length and width. The sub-transistors N3-1 to N3-4 are sequentially disposed in a first column of a first row, a second column of a second row, a third column of the first row, and a fourth column of the second row. The sub-transistors N4-1 to N4-4 are sequentially disposed in a first column of the second row, a second column of the first row, a third column of the second row, and a fourth column of the first row. Therefore, in each row and each column of the circuit block 30a, the sub-transistors N3-1 to N3-4 of the transistor N3 and the sub-transistors N4-1 to N4-4 of the transistor N4 are all disposed in a staggered manner. The sub-transistors N3-1 to N3-4 of the transistor N3 and the sub-transistors N4-1 to N4-4 of the transistor N4 are disposed in the first row and the second row alternately in a checkerboard pattern.

The sub-transistors P3-1 to P3-4 are sequentially disposed in a fifth column of a first row, a sixth column of a second row, a seventh column of the first row, and an eighth column of the second row. The sub-transistors P4-1 to P4-4 are sequentially disposed in a fifth column of the second row, a sixth column of the first row, a seventh column of the second row, and an eighth column of the first row. Therefore, in each row and each column of the circuit block 30a, the sub-transistors P3-1 to P3-4 of the transistor P3 and the sub-transistors P4-1 to P4-4 of the transistor P4 are all disposed in a staggered manner. The sub-transistors P3-1 to P3-4 of the transistor P3 and the sub-transistors P4-1 to P4-4 of the transistor P4 are disposed in the first row and the second row alternately in a checkerboard pattern.

A signal line 300a is disposed on an upper side of the circuit block 30a, and a signal line 302a is disposed on a lower side of the circuit block 30a. A signal line 301a is disposed on an upper side of the circuit block 30a, and a signal line 303a is disposed on a lower side of the circuit block 30a. A signal line 304a is connected to the signal lines 300a and 302a, and a signal line 305a is connected to the signal lines 301a and 303a. A signal line 306 completely surrounds the transistors P3 and P4, and a signal line 307 completely surrounds the transistors N3 and N4. The signal lines 300a, 302a may be used to provide an input signal IN1, the signal lines 301a, 303a may be used to provide an input signal IN2, the signal line 306 may be used to provide a first voltage V1, and the signal line 307 may be used to provide the first voltage V1.

In addition, the signal lines 308, 309, 310, 311 are disposed between the first row and the second row of the circuit block 30a, the signal line 308 may be connected to third terminals of the sub-transistors P3-1 to P3-4 alternately disposed in the first row and the second row, the signal line 309 may be connected to third terminals of the sub-transistors P4-1 to P4-4 alternately disposed in the first row and the second row, the signal line 310 may be connected to third terminals of the sub-transistors N3-1 to N3-4 alternately disposed in the first row and the second row, and the signal line 311 may be connected to third terminals of the sub-transistors N4-1 to N4-4 alternately disposed in the first row and the second row.

Therefore, the sub-transistors N3-1, N4-2, N3-3, N4-4, P3-1, P4-2, P3-3, and P4-4 in the first row of the circuit block 30a may obtain the input signals IN1, IN2, the first voltage V1, and the second voltage V2 through the signal lines 300a, 301a, 306, and 307. The sub-transistors N4-1, N3-2, N4-3, N3-4, P4-1, P3-2, P4-3, and P3-4 in the second row of the circuit block 30a may obtain the input signals IN1, IN2, the first voltage V1, and the second voltage V2 through the signal lines 302a, 303a, 306, and 307.

In this way, when the crack CRK occurs in the circuit block 30a, the transistors P3, P4, N3, and N4 may still receive the input signals IN1, IN2, the first voltage V1, and the second voltage V2 to operate without causing complete disability of the circuit block 30a.

Figure 3B:
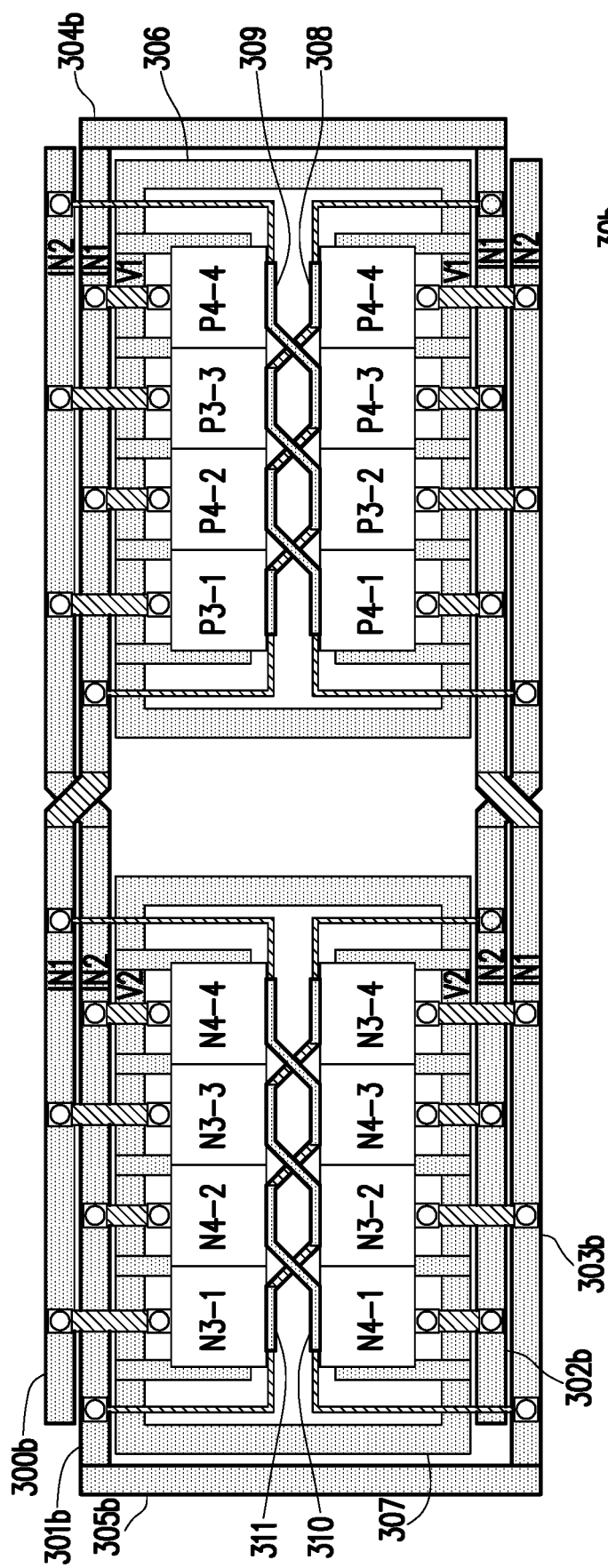
FIG. 3B is a schematic diagram of a circuit block according to an embodiment of the invention.

FIG. 3B is a schematic diagram of a circuit block 30b according to an embodiment of the invention. The circuit block 30b shown in FIG. 3B is similar to the circuit block 30a shown in FIG. 3A, and therefore the same element uses the same symbol. A difference between the circuit block 30a and the circuit block 30b is that signal lines 300a, 301a, 302a, 303a, 304a, and 305a in the circuit block 30a are respectively replaced by signal lines 300b, 301b, 302b, 303b, 304b, and 305b in the circuit block 30b.

The signal line 300b is disposed on an upper side of the circuit block 30b, and the signal line 302b is disposed on a lower side of the circuit block 30b. The signal line 301b is disposed on an upper side of the circuit block 30b, and the signal line 303b is disposed on a lower side of the circuit block 30b. The signal line 304b is connected to the signal lines 300b and 302b, and the signal line 305b is connected to the signal lines 301b and 303b. The signal lines 300b and 302b may be used to provide an input signal IN1, and the signal lines 301b and 303b may be used to provide an input signal IN2.

Therefore, sub-transistors N3-1, N4-2, N3-3, N4-4, P3-1, P4-2, P3-3, and P4-4 in the first row of the circuit block 30b may obtain the input signals IN1, IN2, a first voltage V1, and a second voltage V2 through the signal lines 300b, 301b, 306, and 307. Sub-transistors N4-1, N3-2, N4-3, N3-4, P4-1, P3-2, P4-3, and P3-4 in the second row of the circuit block 30b may obtain the input signals IN1, IN2, the first voltage V1, and the second voltage V2 through the signal lines 302a, 303b, 306, and 307.

In this way, when the crack CRK occurs in the circuit block 30b, the transistors P3, P4, N3, and N4 may still receive the input signals IN1, IN2, the first voltage V1, and the second voltage V2 to operate without causing complete disability of the circuit block 30b.

Figure 4A:
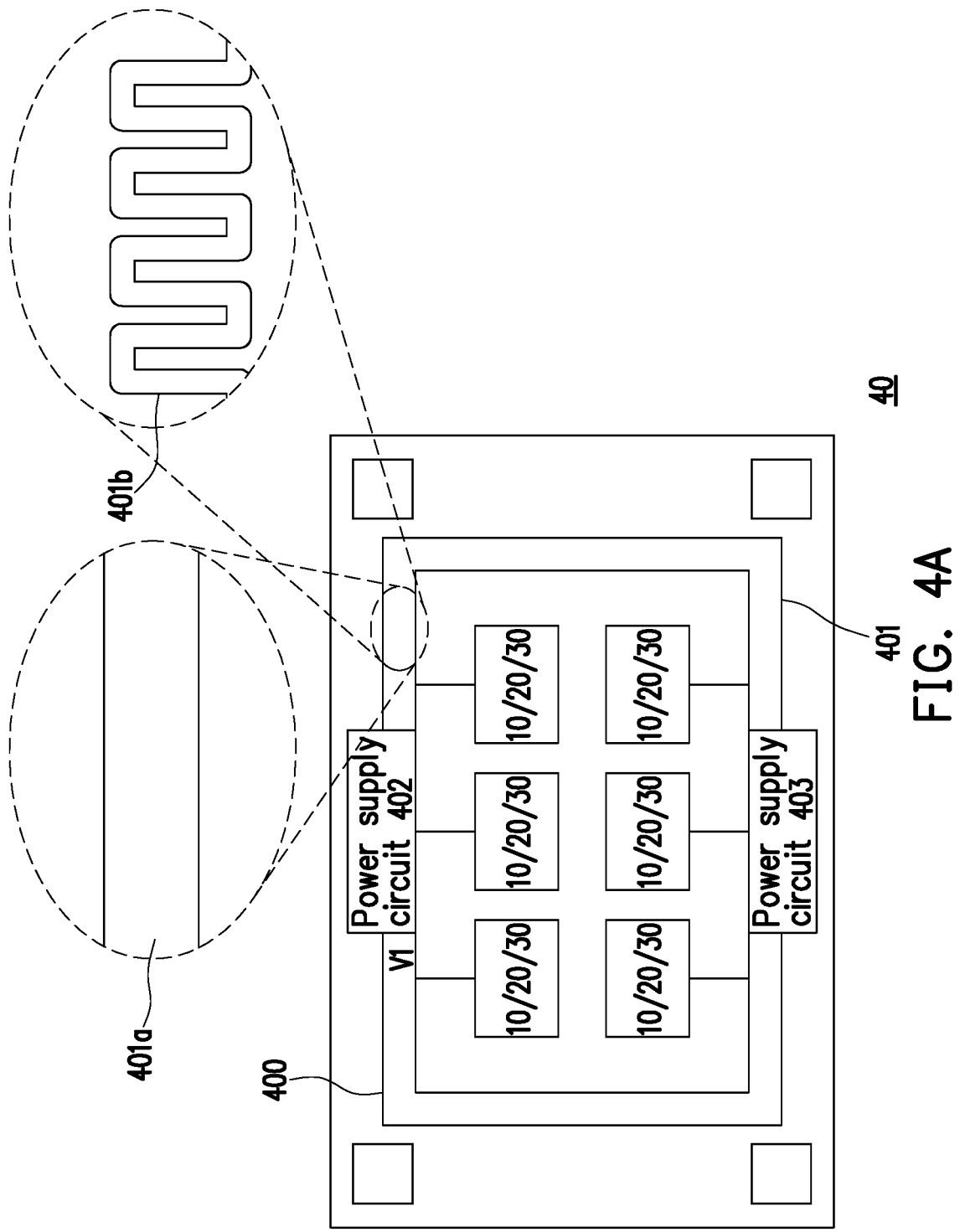
FIG. 4A is a schematic diagram of a chip according to an embodiment of the invention.

FIG. 4A is a schematic diagram of a chip 40 according to an embodiment of the invention. The chip 40 is provided with a plurality of circuit blocks 10/20/30, power traces 400 and 401, and power supply circuits 402 and 403. The power supply circuits 402 and 403 may provide a first voltage V1 for the power traces 400 and 401. The circuit blocks 10/20/30 are coupled to the power traces 400 and 401 to receive the first voltage V1. In an embodiment, the chip 40 may be disposed on a flexible substrate. Due to the bendability of the flexible substrate, a crack is more likely to occur in the power traces 400 and 401 on the flexible substrate.

In detail, two ends of the power trace 400 are coupled to the power supply circuits 402 and 403. Two ends of the power trace 401 are coupled to the power supply circuits 402 and 403. In this way, the power traces 400 and 402 may jointly form a ring structure to surround the chip 40. In this way, when a crack occurs in the power trace 400 or the power trace 402, the chip 40 may still stably transmit the first voltage V1 to all circuit blocks 10/20/30 through the ring structure of the power traces 400 and 402. Therefore, none of the circuit blocks 10/20/30 in the chip 40 may be disabled due to the crack.

In addition, by disposing the power supply circuits 402, 403 in the chip 40, the first voltage V1 provided on the power traces 400, 401 may be further stabilized, thereby further alleviating attenuation of the first voltage V1 caused by the impedance of the power traces 400 and 401 during transmission of the first voltage V1.

In addition, as circled in FIG. 4A, the power traces 400, 401 may have a plurality of implementations. In an embodiment, the power trace 401a may be a line connection structure. In another embodiment, the power trace 401b may be a square wave-like structure, so that when the chip 40 is disposed on the flexible substrate, the power trace 401b may provide, through the square wave-like structure, better flexibility when the chip 40 is entirely bent, and prevent the chip 40 from cracking.

Figure 4B:
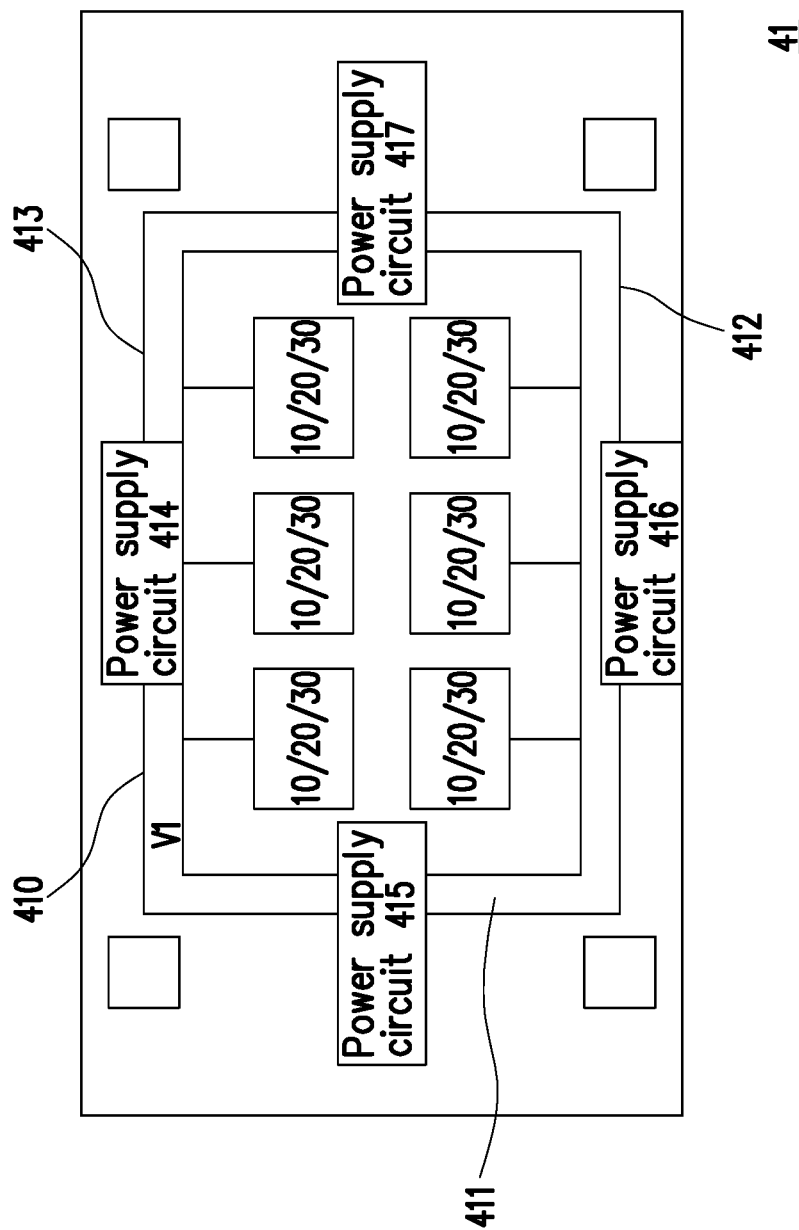
FIG. 4B is a schematic diagram of a chip according to an embodiment of the invention.

FIG. 4B is a schematic diagram of a chip 41 according to an embodiment of the invention. The chip 41 is provided with a plurality of circuit blocks 10/20/30, power traces 410 to 413, and power supply circuits 414 to 417. The power supply circuits 414 to 417 may provide a first voltage V1 for the power traces 410 to 413. The circuit blocks 10/20/30 are coupled to the power traces 410 to 413 to receive the first voltage V1. In an embodiment, the chip 41 may be disposed on a flexible substrate. Due to the bendability of the flexible substrate, a crack is more likely to occur in the power traces 410 to 413 on the flexible substrate.

In detail, two ends of the power trace 410 are coupled to the power supply circuits 414 and 415. Two ends of the power trace 411 are coupled to the power supply circuits 415 and 416, two ends of the power trace 412 are coupled to the power supply circuits 416 and 417, and two ends of the power trace 413 are coupled to the power supply circuits 417 and 414. In this way, the power traces 410 to 413 may jointly form a ring structure to surround the chip 41. In this way, when a crack occurs in any one or more of the power traces 410 to 413, the chip 41 may still stably transmit the first voltage V1 to all circuit blocks 10/20/30 through the ring structure of the power traces 410 to 413 and the power supply circuits 414 to 417. Therefore, none of the circuit blocks 10/20/30 in the chip 41 may be disabled due to the crack.

In addition, by disposing the power supply circuits 414 to 417 in the chip 41, the first voltage V1 provided on the power traces 410 to 413 may be further stabilized, thereby further alleviating attenuation of the first voltage V1 caused by the impedance of the power traces 410 to 413 during transmission of the first voltage V1.

Based on the above, in the invention, different transistors are disposed in the first row and the second row of the circuit block in a staggered manner, and provide the input signals for the transistors in the first row and the second row through different signal lines, so that when a crack occurs on the chip, complete disability of the circuit block may be effectively avoided.

What is claimed is:

1. A chip, comprising:
   a circuit block, comprising:
      a first transistor, divided into a plurality of first sub-transistors connected in parallel; and
      a second transistor, divided into a plurality of second sub-transistors connected in parallel;
   a power trace, divided into a first power trace and a second power trace connected in series, wherein the power trace is coupled to the circuit block; and
   a power supply circuit, divided into a first power supply circuit and a second power supply circuit, wherein the power supply circuit is coupled to the power trace and provides a first voltage to the circuit block through the power trace, wherein
   the first sub-transistors and the second sub-transistors are disposed in a first row and a second row of the circuit block in a staggered manner,
   the first sub-transistors disposed in the first row and the second row respectively receive a first input signal through different signal lines,
   the second sub-transistors disposed in the first row and the second row respectively receive a second input signal through different signal lines, and
   two ends of the first power trace are respectively coupled to the first power supply circuit and the second power supply circuit, and two ends of the second power trace are respectively coupled to the first power supply circuit and the second power supply circuit.

2. The chip according to claim 1, wherein the first sub-transistors and the second sub-transistors are disposed in each column of the circuit block in a staggered manner.

3. The chip according to claim 1, wherein the first transistors disposed in the first row and the second row respectively receive the first input signal through a first signal line and a third signal line, and the second transistors disposed in the first row and the second row respectively receive the second input signal through a second signal line and a fourth signal line.

4. The chip according to claim 3, wherein the first signal line and the second signal line are disposed on a first side of the circuit block, the third signal line and the fourth signal line are disposed on a second side of the circuit block, the first side is adjacent to the first row, and the second side is adjacent to the second row.

5. The chip according to claim 3, wherein the circuit block further comprises:
   a fifth signal line, wherein two ends of the fifth signal line are respectively coupled to the first signal line and the third signal line; and
   a sixth signal line, wherein two ends of the sixth signal line are respectively coupled to the second signal line and the fourth signal line, wherein
   the first signal line, the third signal line, and the fifth signal line surround the first transistor and the second transistor, and the second signal line, the fourth signal line, and the sixth signal line surround the first transistor and the second transistor.

6. The chip according to claim 3, wherein the circuit block further comprises a seventh signal line completely surrounding the first transistor and the second transistor, and the first transistor and the second transistor receive a first voltage from the seventh signal line.

7. The chip according to claim 1, wherein the first transistor and the second transistor have the same conductive type.

8. The chip according to claim 1, wherein the power trace completely surrounds the chip.

9. A chip, comprising:
a circuit block;
a power trace, divided into a first power trace and a second power trace connected in series, wherein the power trace is coupled to the circuit block; and
a power supply circuit, divided into a first power supply circuit and a second power supply circuit, wherein the power supply circuit is coupled to the power trace and provides a first voltage to both of the first power trace and the second power trace, in order to provide power to the circuit block, wherein
two ends of the first power trace are respectively coupled to the first power supply circuit and the second power supply circuit, and two ends of the second power trace are respectively coupled to the first power supply circuit and the second power supply circuit,
wherein the first power trace and the second power trace completely surround the chip.

10. A chip, comprising:
a circuit block, comprising:
  a first transistor, divided into a plurality of first sub-transistors connected in parallel; and
  a second transistor, divided into a plurality of second sub-transistors connected in parallel, wherein
the first sub-transistors are disposed in at east one odd columns of a first row and at least one even columns of a second row,
the second sub-transistors are disposed in the at least one even columns of the first row and the at least one odd columns of the second row,
the first sub-transistors disposed in the first row and the second row respectively receive a first input signal through different signal lines, and
the second sub-transistors disposed in the first row and the second row respectively receive a second input signal through different signal lines.

11. The chip according to claim 10, wherein the first sub-transistors and the second sub-transistors are disposed in each column of the circuit block in a staggered manner.

12. The chip according to claim 10, wherein the first sub-transistors disposed in the first row and the second row respectively receive the first input signal through a first signal line and a third signal line, and the second sub-transistors disposed in the first row and the second row respectively receive the second input signal through a second signal line and a fourth signal line.

13. The chip according to claim 12, wherein the circuit block further comprises:
a fifth signal line, wherein two ends of the fifth signal line are respectively coupled to the first signal line and the third signal line; and
a sixth signal line, wherein two ends of the sixth signal line are respectively coupled to the second signal line and the fourth signal line, wherein
the first signal line, the third signal line, and the fifth signal line surround the first transistor and the second transistor, and the second signal line, the fourth signal line, and the sixth signal line surround the first transistor and the second transistor.

14. The chip according to claim 12, wherein the circuit block further comprises a seventh signal line completely surrounding the first transistor and the second transistor, and the first transistor and the second transistor receive a first voltage from the seventh signal line.

15. The chip according to claim 12, wherein the first transistor and the second transistor have the same conductive type.

16. The chip according to claim 12, wherein the chip further comprises:
a power trace, divided into a first power trace and a second power trace connected in series, wherein the power trace is coupled to the circuit block; and
a power supply circuit, divided into a first power supply circuit and a second power supply circuit, wherein the power supply circuit is coupled to the power trace and provides a first voltage to the circuit block through the power trace, wherein
two ends of the first power trace are respectively coupled to the first power supply circuit and the second power supply circuit, and two ends of the second power trace are respectively coupled to the first power supply circuit and the second power supply circuit.

17. The chip according to claim 16, wherein the power trace completely surrounds the chip.

18. The chip according to claim 12, wherein the first signal line and the second signal line are disposed on a first side of the circuit block, the third signal line and the fourth signal line are disposed on a second side of the circuit block, the first side is adjacent to the first row, and the second side is adjacent to the second row.

* * * * *